United States Patent
Liu et al.

(10) Patent No.: US 12,126,303 B2
(45) Date of Patent: Oct. 22, 2024

(54) SPIN TORQUE OSCILLATOR MASER

(71) Applicant: Massachusetts Institute of Technology, Cambridge, MA (US)

(72) Inventors: Luqiao Liu, Brookline, MA (US); Justin Hou, Cambridge, MA (US); Pengxiang Zhang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 39 days.

(21) Appl. No.: 18/193,885

(22) Filed: Mar. 31, 2023

(65) Prior Publication Data
US 2023/0387855 A1 Nov. 30, 2023

Related U.S. Application Data

(60) Provisional application No. 63/347,155, filed on May 31, 2022.

(51) Int. Cl.
| | |
|---|---|
| *H03B 15/00* | (2006.01) |
| *H01F 10/32* | (2006.01) |
| *H01S 1/02* | (2006.01) |

(52) U.S. Cl.
CPC ......... *H03B 15/006* (2013.01); *H01F 10/329* (2013.01); *H01S 1/02* (2013.01)

(58) Field of Classification Search
CPC ..... H03B 15/006; H01S 1/02; H01S 2302/02; B82Y 25/00; H01F 10/329
See application file for complete search history.

(56) References Cited

U.S. PATENT DOCUMENTS

2020/0225152 A1* 7/2020 Tankhilevich ......... B82Y 25/00

OTHER PUBLICATIONS

Zhang, Xufeng, et al. "Strongly coupled magnons and cavity microwave photons." Physical review letters 113.15 (2014): 156401. (Year: 2014).*
"Maser"; Encyclopedia Britannica, Inc.; Jan. 31, 2020; 3 Pages.
Abdulrehem et al.; "Low Dimensional Description of Pedestrian-Induced Oscillation of the Millennium Bridge; Chaos: An Interdisclipinary Journal of Nonlinear Science"; vol. 19; Mar. 13, 2009; 18 Pages.
Amiri et al.; "Voltage-Controlled Magnetic Anisotropy in Spintronic Devices"; SPIN; World Scientific Publishing Company; vol. 2, No. 3; Oct. 29, 2012; 10 Pages.

(Continued)

*Primary Examiner* — Ryan Johnson
(74) *Attorney, Agent, or Firm* — Daly, Crowley, Mofford & Durkee, LLP (57) ABSTRACT

An oscillator comprising, a cavity wherein the cavity comprises an electrical conductor. The oscillator comprising an electrical insulator disposed on a surface of the cavity; and a heterostructure disposed on a surface of the electrical insulator and having a first end and a second end, the heterostructure comprising one or more spin current source layers and one or more magnetic material layers. In response to an electrical current passed through the spin current source, an oscillation occurs in a plurality of magnetic domains of the magnetic material, wherein the oscillations have substantially the same phase.

18 Claims, 8 Drawing Sheets

(56) References Cited

OTHER PUBLICATIONS

Ando, et al.; "Electric Manipulation of Spin Relaxation Using the Spin Hall Effect"; Physical Review Letters; vol. 101; Jul. 18, 2008; 4 Pages.
Astafiev et al.; "Single artificial-atom lasing"; Nature; vol. 449; Oct. 4, 2007; 3 Pages.
Awschalom et al.; "Quantum Engineering With Hybrid Magnonic Systems and Materials"; IEEE Transactions on Quantum Engineering; vol. 2; Feb. 8, 2021; 36 Pages.
Bai et al.; "Spin Pumping in Electrodynamically Coupled Magnon-Photon Systems"; arXiv:1504.01335v1; Apr. 6, 2015; 5 Pages.
Bardin et al.; "Microwaves in Quantum Computing"; arXiv.2011/01480v1; Nov. 3, 2020; 30 Pages.
Bialczak et al.; "Fast Tunable Coupler for Superconducting Qubits"; Physical Review Letters; vol. 106; Feb. 11, 2011; 4 Pages.
Bienfait et al.; "Controlling spin relaxation with a cavity"; arXiv:1508.06148v2; Aug. 27, 2015; 21 Pages.
Borenstein et al.; "Classical Laser"; Physical Review A; vol. 5, No. 3; Mar. 1972; 14 Pages.
Breeze et al.; "Continuous-wave room-temperature diamond maser"; Naturel vol. 555; Mar. 22, 2018; 8 Pages.
Cao et al.; "Exchange magnon-polaritons in microwave cavities"; arXiv:1412.5809v3; Mar. 24, 2015; 6 Pages.
Cassidy et al.; "Demonstration of an ac Josephson junction laser"; Science; vol. 355; 2017; 16 Pages.
Cecot et al.; "Influence of intermixing at the Ta/CoFeB interface on spin Hall angle in Ta/CoFeB/MgO heterostructures"; Nature, Scientific Reports; Apr. 20, 2017; 11 Pages.
Chen et al.; "Spin-Torque and Spin-Hall Nano-Oscillators"; Proceedings of the IEEE; vol. 104, No. 10; Oct. 2016; 27 Pages.
Colson et al.; "One-Body Electron Dynamics in a Free Electron Laser"; Physics Letters; vol. 64A, No. 2; Dec. 12, 1977; 3 Pages.
Deac et al.; "Bias-driven high-power microwave emission from MgO-based tunnel magnetoresistance devices"; Nature Physics; vol. 4; Aug. 10, 2008; 37 Pages.
Demidov et al.; "Control of Magnetic Fluctuations by Spin Current"; Phys. Rev. Lett.; vol. 107; Sep. 2, 2011; 18 Pages.
Demidov et al.; "Magnetic nano-oscillator driven by pure spin current"; Nature materials; Oct. 14, 2012; 4 Pages.
Demidov et al.; "Nanoconstriction-based spin-Hall nano-oscillator"; Applied Physics Letters; vol. 105; Oct. 31, 2014; 5 Pages.
Demidov et al.; "Synchronization of spin hall nano-oscillators to external microwave signals"; Nature Communications; Jan. 23, 2014; 6 Pages.
Divinskiy et al.; "Controlled nonlinear magnetic damping in spin-hall nano-devices"; Nature Communications; 2019; 7 Pages.
Duan et al.; "Nanowire spin torque oscillator driven by spin orbit torques"; Nature Communications; Dec. 5, 2014; 7 Pages.
Emori et al.; "Spin-orbit torque and spin pumping in YIG/Pt with interfacial insertion layers"; arXiv:1802.03865v3; Apr. 29, 2018; 5 Pages.
Flovik et al.; "Describing synchronization and topological excitations in arrays of magnetic spin torque oscillators through the Kuramoto model"; Scientific Reports; Sep. 1, 2016; 10 Pages.
Gao et al.; "Noise properties of superconducting coplanar waveguide microwave resonators"; Appl. Phys. Lett.; vol. 90; Mar. 8, 2007; 4 Pages.
Gardiner et al.; "Input and output in damped quantum systems: Quantum stochastic differential equations and the master equation"; Physical Review A; vol. 31, No. 6; Jun. 1985; 14 Pages.
Georges et al.; "Coupling Efficiency for Phase Locking of a Spin Transfer Nano-Oscillator to a Microwave Current"; arXiv:0802.4162v3; May 21, 2008; 14 Pages.
Goppl et al.; "Coplanar waveguide resonators for circuit quantum electrodynamics"; arXiv:0807.4094v1; Jul. 25, 2008; 8 Pages.
Grollier et al.; "Synchronization of spin-transfer oscillators driven by stimulated microwave currents"; arXiv:cond-mat/050932v2; Nov. 2, 2005; 5 Pages.

Guo et al.; "Intrinsic spin Hall effect in Platinum metal"; Physical Review Letters; vol. 100; Mar. 3, 2008; 4 Pages.
Harder et al.; "Level Attraction Due to Dissipative Magnon-Photon Coupling"; arXiv:1809.01233v1; Sep. 4, 2018; 5 Pages.
Haygood et al.; "Strong Coupling of an Fe—Co Alloy with Ultralow Damping to Superconducting Co-planar Waveguide Resonators"; Phys. Rev. Applied; vol. 15; May 11, 2021; 14 Pages.
Hime et al.; "Solid-State Qubits with Current-Controlled Coupling"; Science Magazine; vol. 314; Dec. 1, 2006; 4 Pages.
Hong et al.; "Collective synchronization in spatially extended systems of coupled oscillators with random frequencies"; arXiv:cond/0408553v1; Aug. 26, 2004; 18 Pages.
Hopf et al.; "Classical Theory of a Free-Electron Laser"; Optics Communications; vol. 18, No. 4; Sep. 1976; 4 Pages.
Hou et al.; "Strong Coupling between Microwave Photons and Nanomagnet Magnons"; Physical Review Letters; vol. 123; Sep. 3, 2019; 5 Pages.
Hou, et al.; "Proposal for a Spin-Torque-Oscillator Maser Enabled by Microwave Photon-Spin Coupling"; Phys. Rev. Applied; vol. 16; Sep. 20, 2021; 13 Pages.
Houck et al.; "Controlling the spontaneous emission of a superconducting transmon qubit"; arXiv:0803.4490v1; Mar. 31, 2008; 4 Pages.
Houssameddine et al.; "Spin-torque oscillator using a perpendicular polarizer and a planar free layer"; Nature Materials; vol. 6; Apr. 29, 2007; 7 Pages.
Hu et al.; "Cavity Spintronics Gets More with Less"; Physics; vol. 12; Sep. 3, 2019; 6 Pages.
Huebl et al.; "High cooperativity in coupled microwave resonator ferrimagnetic insulator hybrids"; arXiv:1207.6039v2; Aug. 29, 2013; 5 Pages.
Kaka et al.; "Mutual phase-locking of microwave spin torque nano-oscillators"; Nature, vol. 437; Sep. 15, 2005; 4 Pages.
Keller et al.; "Nonwhite frequency noise in spin torque oscillators and its effect on spectral linewidth"; arXiv:1005.5372v1; May 28, 2010; 9 Pages.
Kim et al.; "Generation Linewidth of an Auto-Oscillator with a Nonlinear Frequency Shift: Spin-Torque Nano-Oscillators"; arXiv:cond-mat/0703317v2; Jun. 26, 2007; 4 Pages.
Kiselev et al.; "Microwave oscillations of a nanomagnet driven by a spin-polarized current"; Nature; vol. 425; Sep. 2003; 15 Pages.
Krivorotov et al.; "Time-domain measurements of nanomagnet dynamics driven by spin-transfer torques"; Science—Reports; vol. 307; Jan. 14, 2005; 4 Pages.
Kubo et al.; "Strong Coupling of a Spin Ensemble to a Superconducting Resonator"; arXiv:1006:0251v3; Sep. 30, 2010; 4 Pages.
Kurizki et al.; "Quantum technologies with hybrid systems"; Physical Sciences; vol. 112; Mar. 3, 2015; 16 Pages.
Lachance-Quirion et al.; "Hybrid quantum systems based on magnonics"; Applied Physics Express; vol. 12; Jun. 4, 2019; 18 Pages.
Lamb; "Theory of an Optical Maser"; Physical Review; vol. 134, No. 6A; Jun. 15, 1964; 22 Pages.
Li et al.; "Hybrid magnonics; Physics, Circuits, and applications for coherent information processing"; J. Appl. Phys.; vol. 128; Oct. 5, 2020; 17 Pages.
Li et al.; "Strong Coupling between Magnons and Microwave Photons in On-Chip Ferromagnet-Superconductor Thin-Film Devices"; Phys. Rev. Lett.; vol. 123; Sep. 3, 2019; 7 Pages.
Liu et al.; "Magnetic Oscillations Driven by the Spin Hall Effect in 3-Terminal Magnetic Tunnel Junction Devices"; Phys. Rev. Lett. 109; Oct. 31, 2012; 15 Pages.
Liu et al.; "Semiconductor double quantum dot micromaser"; Science; vol. 347; 2015; 24 Pages.
Liu et al.; "Spin-torque switching with the giant spin Hall effect of tantalum"; Science: vol. 336; May 4, 2012; 31 Pages.
Locatelli et al.; "Efficient Synchronization of dipolarly coupled vortex-based spin transfer nano-oscillators"; Scientific Reports; Nov. 25, 2015; 10 Pages.
Mancoff et al.; "Phase-locking in double-point-contact spin-transfer devices"; Nature; vol. 437; Sep. 15, 2005; 3 Pages.
Maruyama et al.; "Large Voltage-induced magnetic anisotropy change in a few atomic layers of iron"; Nature Nanotechnology; vol. 4; Mar. 2009; 3 Pages.

(56) References Cited

OTHER PUBLICATIONS

Miron et al.; "Perpendicular switching of a single ferromagnetic layer induced by in-plane current injection"; Nature; vol. 476; 2011; 7 Pages.

Morota et al.; "Indication of intrinsic spin Hall effect in 4d and 5d transition metals"; arXiv: 1008.0158v3; May 6, 2011; 5 Pages.

Niskanen et al.; "Quantum Coherent Tunable Coupling of Superconducting Qubits"; Science Magazine; vol. 316; May 4, 2007; 5 Pages.

Ott et al.; "Low Dimensional Behavior of Large Systems of Globally Coupled Oscillators"; arXiv:0806.0004v1; Jun. 2, 2008; 16 Pages.

Pai et al.; "Dependence of the efficiency of spin Hall torque on the transparency of Pt/ferromagnetic layer interfaces"; Phys. Rev. B; vol. 92; Aug. 31, 2015; 42 Pages.

Pribiag et al.; "Magnetic vortex oscillator driven by dc spin-polarized current"; Nature Physics; vol. 3; Jul. 2007; 14 Pages.

Rahim et al.; "Metallic coplanar resonators optimized for low-temperature measurements"; Journal of Physics D: Applied Physics; vol. 49; Sep. 8, 2016; 6 Pages.

Rana et al.; "Excitation of coherent propagating spin waves in ultrathin CoFeB film by voltage-controlled magnetic anisotropy"; Appl. Phys. Lett.; vol. 111, Aug. 1, 2017; 6 Pages.

Rezende et al.; "Mode Locking of Spin Waves Excited by Direct Currents in Microwave Nano-Oscillators"; Physical Review Letters; vol. 98; Feb. 23, 2007; 4 Pages.

Rippard et al.; "Direct-Current Induced Dynamics in Co90Fe10/Ni80Fe20 Point Contacts"; Physical Review Letters; vol. 92; Jan. 15, 2004; 17 Pages.

Rippard et al.; "Injection Locking and Phase Control of Spin Transfer Nano-Oscillators"; Physical Review Letters; vol. 95; Aug. 5, 2005; 4 Pages.

Romera et al.; "Vowel recognition with four coupled spin-torque nano-oscillators"; Nature; vol. 563; Oct. 29, 2018; 34 Pages.

Ruotolo et al.; "Phase-locking of magnetic vortices mediated by antivorties"; Nature Nanotechnology; vol. 4; Jun. 21, 2009; 5 Pages.

Sagasta et al.; "Spin diffusion length of Permalloy using spin absorption in lateral spin valves"; Applied Physics Letters; vol. 111, No. 8; Aug. 21, 2017; 8 Pages.

Schuster et al.; "High cooperativity coupling of electron-spin ensembles to superconducting cavities"; arXiv:1006.0242v1; Jun. 1, 2010; 5 Pages.

Schwartz et al.; "Temperature Coefficient of Resistance of Beta-Tantalum Films and Mixtures with B.C.C.—Tantalum"; Thin Solid Films; vol. 14; Jul. 28, 1972; 15 Pages.

Shao et al.; "Roadmap of Spin-Orbit Torques"; IEEE Transactions on Magnetics; vol. 57; No. 7; Jul. 2021; 39 Pages.

Simon et al.; "Theory of the Josephson Junction Laser"; arXiv:1708.02435v2; Jul. 10, 2018; 11 Pages.

Slavin et al.; "Excitation of Spin Waves by Spin-Polarized Current in Magnetic Nano-Structures"; IEEE Transactions on Magnetics; vol. 44, No. 7; Jul. 2008; 12 Pages.

Slavin et al.; "Nonlinear auto-oscillator theory of microwave generation by spin-polarized current"; IEEE Transactions on Magnetics; vol. 45, No. 4; Apr. 2009; 44 Pages.

Smith et al.; "Dimensional crossover in spin Hall oscillators"; arXiv:2005.01925v2; Oct. 9, 2020; 15 Pages.

Soykal et al.; "Strong Field Interactions between a Nanomagnet and a Photonic Cavity"; Physical Review Letters; vol. 104; Feb. 19, 2010; 4 Pages.

Strogatz et al.; "Crowd Synchrony on the Millennium Bridge"; Nature, Brief Communications; Vo. 438; Nov. 3, 2005; 2 Pages.

Tabuchi et al.; "Coherent coupling between ferromagnetic magnon and superconducting qubit"; arXiv:1410.3781v1; Oct. 14, 2014; 12 Pages.

Tabuchi et al.; "Hybridizing ferromagnetic magnons and microwave photons in the quantum limit"; arXiv:1405.1913v2; Oct. 14, 2014; 5 Pages.

Tamaru et al.; "Extremely coherent microwave emission from spin torque oscillator stabilized by phase locked loop"; Scientific Reports; Dec. 11, 2015; 6 Pages.

Tanaka et al.; "Study of Intrinsic Spin Hall Effect and Orbital Hall Effect in 4d-and 5d Transition Metals"; arXiv:0711.1263v4; Feb. 26, 2008; 17 Pages.

Tao et al.; "Self-consistent determination of spin Hall angle and spin diffusion length in Pt and Pd: The Role of the interface spin loss"; Science Advances; vol. 4; Jun. 22, 2018; 8 Pages.

Torrejon et al.; "Neuromorphic computing with nanoscale spintronic oscillators"; Nature; vol. 547; Jul. 26, 2017; 13 Pages.

Tsunegi et al.; "Scaling up electrically synchronized spin torque oscillator networks"; Nature, Scientific Reports; Sep. 7, 2018; 7 Pages.

Tsunegi et al.; "Self-injection locking of a vortex spin torque oscillator by delayed feedback"; Scientific Reports; May 31, 2016; 7 Pages.

Tulapurkar et al.; "Spin-torque diode effect in magnetic tunnel junctions"; Nature—Letters; vol. 438; Nov. 17, 2005; 4 Pages.

Vansteenkiste et al.; "The design and verification of MuMax3"; AIP Advances; vol. 4; Oct. 20, 2014; 23 Pages.

Liu et al.; "Spin-Torque Ferromagnetic Resonance Induced by the Spin Hall Effect;" Phys. Rev. Lett.; vol. 106; Jan. 20, 2011; 15 Pages.

Wallraff et al.; "Strong coupling of a single photon to a superconducting qubit using circuit quantum electrodynamics"; Nature; vol. 431; Sep. 9, 2004; 6 Pages.

Wang et al.; "Nonreciprocity and Unidirectional Invisibility in Cavity Magnonics"; Physical Review Letters; vol. 123; Sep. 18, 2019; 6 Pages.

Woo et al.; "Enhanced spin-orbit torques in Pt/Co/Ta heterostructures"; Applied Physics Letters; vol. 105, No. 21; Nov. 24, 2014; 6 Pages.

Xiang et al.; "Hybrid quantum circuits: Superconducting circuits interacting with other quantum systems"; arXiv:1204.2137v5; Apr. 10, 2013; 35 Pages.

Xu et al.; "Floquet Cavity Electromagnetics"; arXiv:2010.14727v1; Oct. 28, 2020; 9 Pages.

Xu et al.; "Strong photon-magnon coupling using a lithographically defined organic ferrimagnet"; arXiv:221204423v1; Dec. 8, 2022; 31 Pages.

Yao et al.; "Coherent Microwave Emission of a Gain-Driven Polariton"; arXiv:2302.08904v1; Feb. 15, 2023; 6 Pages.

Yu et al.; "Fingerprint of the inverse Rashba-Edelstein effect at heavy-metal/Cu interfaces"; Physical Review B; vol. 102; Oct. 12, 2020; 7 Pages.

Yu et al.; "Large spin-orbit toques in Pt/Co-Ni/W heterostructures"; Appl. Phys. Lett.; vol. 109; Jul. 26, 2016; 6 Pages.

Yu et al.; "Prediction of Attractive Level Crossing via a Dissipative Mode"; Physical Review Letters; vol. 123; Nov. 26, 2019; 6 Pages.

Zahedinejad et al.; "Two-dimensional mutually synchronized spin Hall nano-oscillator arrays for neuromorphic computing"; Nature Nanotechnology; vol. 15; Jan. 2020; 8 Pages.

Zhang et al.; "Broadband Nonreciprocity Enabled by Strong Coupling of Magnons and Microwave Photons"; Phys. Rev. Applied; vol. 13; Apr. 15, 2020; 12 Pages.

Zhang et al.; "Strongly Couple Magnons and Cavity Microwave Photons"; Physical Review Letters; vol. 113; Oct. 7, 2014, 5 Pages.

Zhu et al.; "Magnon-photon strong coupling for tunable microwave circulators"; Physical Review A; vol. 101; Apr. 28, 2020; 9 Pages.

\* cited by examiner

SPIN TORQUE OSCILLATOR MASER

CROSS-REFERENCE SECTION

This application claims the benefit of U.S. Provisional Application No. 63/347,155, filed May 31, 2022. The entire contents of this application is incorporated herein by reference.

STATEMENT REGARDING FEDERALLY SPONSORED RESEARCH

This invention was made with government support under FA9550-19-1-0048 awarded by the Air Force Office of Scientific Research and ECCS 1653553 awarded by the National Science Foundation. The government has certain rights in the invention.

BACKGROUND

Spin-torque oscillators (STDs) utilize spin-transfer torque effect in quasi-zero-dimensional magnetic systems, such as magnetic tunnel junctions, nanopillar spin valves, and nanocontacts. STOs may be used in a variety of different applications, such as on-chip microwave sources, detectors, and components for neuromorphic circuits and systems. Nanoscale quasi-single-domain structures are generally required since the excitation current needed in such applications scales quickly with changes to the magnetic area. Using the spin-orbit torque, a charge current flowing across a cross section of a heavy metal as a spin current source, the area of which is larger than the cross section that the current flows through, injects spin into a magnetic film with a large area.

However, coherent magnetic self-oscillation over ferromagnetic thin films with multiple domains has proven to be challenging due to the existence of a continuous magnon band. In the continuous magnon band, magnon excitations are quickly scattered into different modes, thus losing phase coherence across the multiple domains.

To restrain this decoherence process, dimension confinement has been used to discretize magnon bands and to enforce coherent oscillation of spins at different regions of the oscillator. However, the size limits imposed by such dimension confinement, limits the amount of power which may be provided by a single nanoscale STO. Various methods have been utilized to overcome the power bottleneck from a single nanoscale STO, including synchronizing different STOs through electrical connections, spin wave interactions, and dipolar interactions. These technologies introduce complexities into devices, circuit designs and fabrication. Furthermore, the small volume of nanoscale STOs renders them susceptible to thermal fluctuations. Therefore, different approaches have been pursued to achieve linewidth reduction with the aid of external circuits and signals.

SUMMARY

Disclosed embodiments provide an approach for realizing magnetic self-oscillation in a large-area ferromagnetic thin film having emission power higher than that achievable using prior art approaches and having linewidths narrower than that achievable using prior art approaches. Such advantages are achieved by exploiting spin-photon coupling.

In accordance with the concepts described herein, the inventors have recognized that with strong enough coupling between an STO and an electrical conductor cavity, spontaneous magnetic oscillations with macroscopic phase coherence can be achieved without any externally applied locking signals, even in large-size ferromagnetic thin films. Moreover, with the increase of the number of spins $N_s$ in the magnetic film, the coupling strength needed for overcoming the synchronization threshold decreases, the microwave output power increases, and the oscillation linewidth becomes narrower. The idea of using an electrical conductor cavity to realize highly coherent emission is rooted in the design principles of the laser or maser, where the phase coherence in different regions of the nonlinear gain medium is enforced by a global coupling mechanism—cavity photons—rather than short-range forces such as dipolar or exchange interactions in conventional STOs.

It is appreciated that the concepts, techniques, and structures disclosed herein may be embodied in many ways, and that the above summary of disclosed embodiments is thus meant to be illustrative rather than comprehensive or limiting. In particular, individual elements of different embodiments described herein may be combined to form other embodiments not specifically set forth above.

For example, the concepts, systems, devices and techniques describe herein may find use in hybrid magnon-photon systems for coherent information processing and transduction. Through the integration of an active spintronic device with a photon mode in a microwave cavity, it is possible to bring new functions to hybrid magnon-photon systems.

Moreover, various elements, which are described in the context of a single embodiment, also may be provided in other embodiments separately, or in any suitable sub-combination. Moreover, other embodiments not specifically described herein also may be within the scope of the claims set forth below.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Described herein is a magnetic oscillator (a spin-torque oscillator (STO) coupled with a resonant cavity). The oscillator is driven by spin-orbit torque disposed in or about a microwave cavity and inductively coupled to the cavity photon mode. To generate the spin orbit torque, a spin-current having a current density $J_s$ for generating damping-like torque is injected into a ferromagnetic thin film, the dynamics of which are coupled with the cavity photon mode. This microwave cavity can be implemented (or "realized") with on-chip two-dimensional resonators for small mode volume and the high single spin-photon coupling strength $g_s/2\pi$, reaching above 10 Hz compared to <0.1 Hz in three-dimensional cavity resonators.

Systems, devices and circuits provided in accordance with the concepts described herein break size, power, and linewidth limitations of traditional STOs. Furthermore, an on-chip, scalable, electrically-driven, continuous-wave maser provided in accordance with the concepts described herein may lead to new applications of maser devices, such as wireless communications, scalable quantum information processing, microwave medical sensing, imaging, and tumor ablation.

Before describing details of exemplary structures embodying the concepts described herein, it should be appreciated that reference is sometimes made herein to particular frequencies, materials and dimension (e.g., lengths, widths, heights). For example, embodiments are described as using metallic, quarter-wavelength resonators. This does not rule out the possibility of achieving a device with other resonator designs, whether they be metallic/superconducting, or half/quarter-wavelength/lumped element etc. That is, such references are made herein merely to promote clarity in the description of the concepts sought to be protected and are not intended as, and should not be construed as, limiting.

Figure 1:
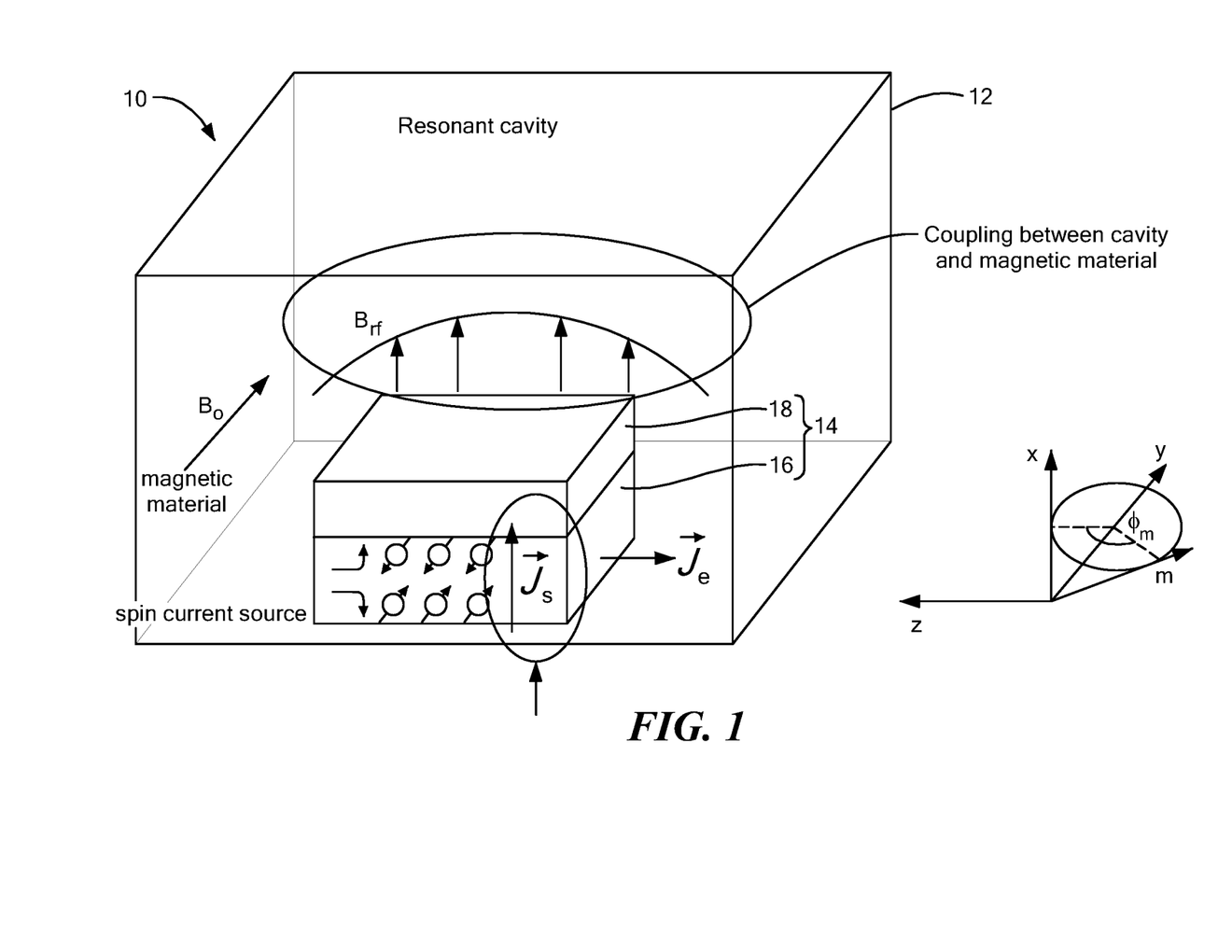
FIG. 1 is a diagrammatic perspective view of a spin-torque oscillator (STO) coupled to a cavity in accordance with an embodiment of the concepts, techniques, and structures disclosed herein.

Referring now to FIG. 1, a spin-torque oscillator (STO) maser 10 (referred to herein as "oscillator system 10" or more simply, "oscillator 10") includes a resonant cavity 12 (e.g. an electrically conductive cavity), and a heterostructure 14 which includes at least one spin current source layer 16 and at least one magnetic material layer 18. Although not explicitly shown in FIG. 1, heterostructure 14 is electrically insulated from conductive cavity 20 (e.g., by an insulating material).

The x-axis, y-axis, and z-axis are given for reference. As will be described in further detail below, in embodiments, heterostructure 14 comprises one or more layers of magnetic material disposed over one or more layers of spin current source layer 16. In response to an electrical current passed through the spin current source 16, an oscillation occurs in a plurality of magnetic domains of the magnetic material layer 18. The oscillations have substantially the same phase.

A static magnetic field $B_o$ and a time varying magnetic field $B_{rf}$ are also depicted in relation to oscillator system 10. The static magnetic field $B_o$ is for biasing magnetic material layer 18. In embodiments, magnetic field $B_o$ may be provided as an external magnetic field. Certain magnetic materials are self-biased with magnetic anisotropies and an external magnetic field is not required.

$B_{rf}$ denotes a time varying magnetic field portion of a radio frequency (RF) signal generated per unit inductor current I. In the presence of a resonator current, each spin experiences an oscillating magnetic field $B_{rf}$ generated by an inductive element (e.g. an inductor). For an on-chip resonator design, $B_{rf}$ may be substantially uniformly polarized across the magnetic device in one specific direction, as indicated. To induce increased (and ideally maximal) spin-photon coupling, $B_{rf}$ may be set in a direction that is perpendicular to external biasing field $B_o$.

In the example embodiment of FIG. 1, $B_{rf}$ may be set such that $B_{rf}=b_{rf}I\hat{x}$ along the x direction, which is perpendicular to external biasing field $B_0=B_0\hat{y}$. Scalable device applications are possible by utilizing on-chip architectures having relatively large spin-photon coupling strength.

As illustrated in FIG. 1, passing current $J_e$ through the spin current source generates spin current $J_s$ (through spin Hall effect) injecting into the magnetic material. The injected spin will compensate magnetic damping and induce magnetic self-oscillation.

It should be appreciated that FIG. 1 is conceptual, rather than physical. In particular, the electric conductor cavity need not provided as a physical box structure or contain the magnetic material or spin current source as such. Rather, physical embodiments of the principles and concepts described herein are illustrated in conjunction with the remaining figures.

Figure 2:
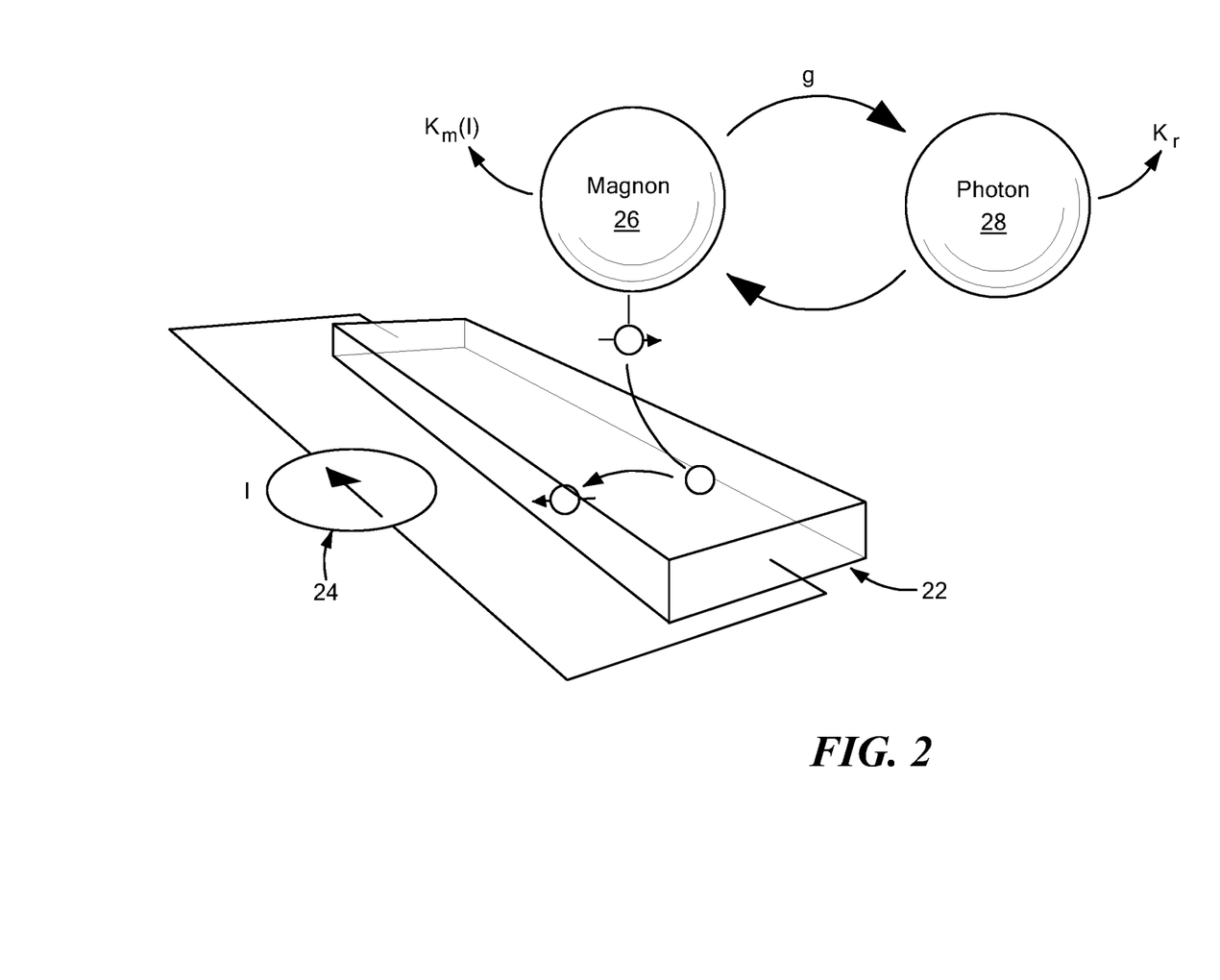
FIG. 2 is a schematic diagram showing a magnon-photon hybrid system in accordance with an embodiment disclosed herein.

FIG. 2 illustrates a magnon-photon hybrid system 22. Magnon-photon hybrid system 22 combines two or more sub-systems, in this case the magnon subsystem and the photon subsystem. The combination of the two or more subsystems provides the magnon-photon hybrid system 22, which has properties that are improved beyond the improvements in like properties that could be obtained via only each individual sub-systems. Adjusting (or "tuning") the properties of the sub-systems can facilitate and improve interactions between the sub-systems in a controllable way. Such improved properties include but are not limited to improvements in control, sensing, transduction, and information processing a magnon-photon hybrid system.

In FIG. 2, a microwave resonator is inductively coupled to magnons 26. A charge current 24 flowing through spin hall effect (SHE) metals injects non-equilibrium spins into neighboring magnetic layers and changes the magnon dissipation rate $K_m$. This influences the dissipation of magnon 26 polaritons resulting from the coupling of magnons 26 and photons 28 and modulates the cooperativity $C=g^2/K_mK_r$, where $K_r$ is the resonator photon dissipation rate and g is the magnon-photon coupling strength. In an embodiment, the magno 26 dissipation can be electrically adjusted (i.e., "tuned") by the SHE by using a charge current 24. Magnon-photon hybrid system 22, may also be tuned through the cooperativity of the magnon-photon hybrid system 22.

The frequencies of the higher-order mode signals of the resonator are often far away from the frequency of the fundamental mode signal and the dimension of the ferromagnetic device is often small compared with the wavelength of this fundamental mode. Therefore, for the spectrum region of interest, the microwave resonator can be modeled as a serial LCR circuit.

Figure 3A:
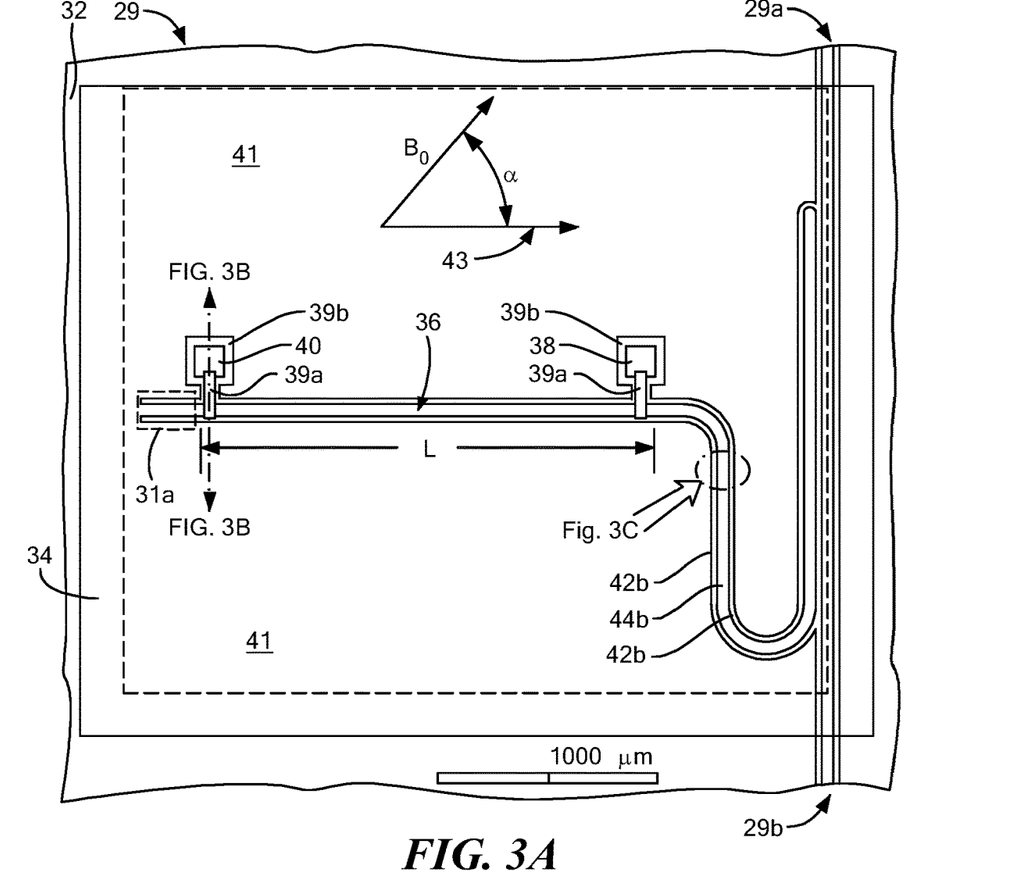
FIG. 3A is a top view of an STO provided from a resonator device in accordance with an embodiment disclosed herein.
Figure 3B:
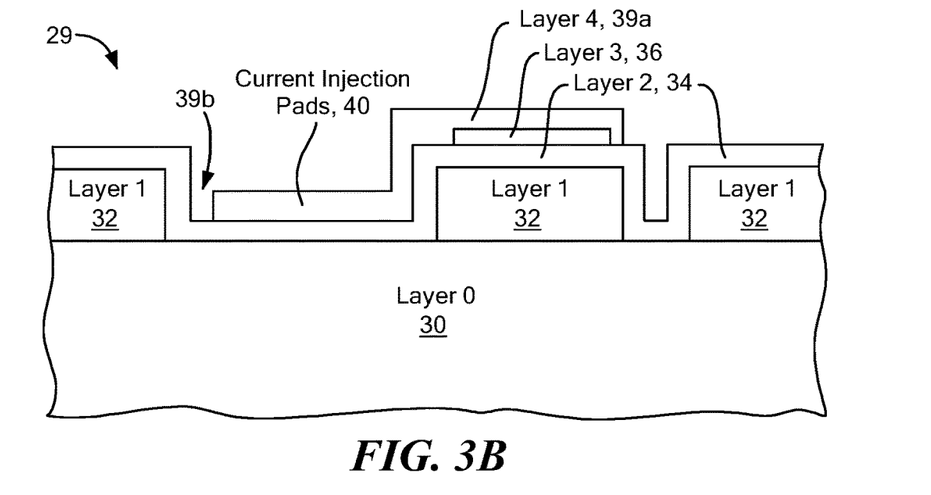
FIG. 3B is a cross sectional view of the STO quarter-wave resonator device taken across lines 3B-3B in FIG. 3A.

Referring now to FIGS. 3A and 3B, in which like elements are provided having like reference designations, an oscillator having ports 29a, 29b, comprises a quarter-wave resonator 29 implemented with a coplanar waveguide transmission line having a first end 31a shorted to ground plane 41 and a second end open, and coupled to an external coplanar waveguide with ports 29a and 29b. In one example embodiment for operation at a frequency of about ~5 GHz the transmission line of the quarter wave resonator has a total length of about 6 mm. In this connection, FIG. 3D illustrates a plot of the microwave transmission as a function of the measurement frequency for two different thicknesses of device copper in an embodiment of the quarter-wave resonator.

As may be most clearly seen in FIG. 3B, resonator 29 comprises a substrate 30 having a cavity 32 disposed thereon. An electric insulator layer 34 is disposed over the substrate 30 and the cavity 32. A heterostructure 36 is then formed over a portion (here a top portion) of the cavity 32. Heterostructure 36 is provided having a length L. Details of heterostructure 36 will be described below in conjunction with FIGS. 5A, 5B. In general, the particular length L of heterostructure 36 will be selected to suit the needs of the particular application. In embodiments operating at a frequency of about 5 GHz, the length L may be in the range of about 0.5 mm to about 3 mm and is preferably in the range of 1 mm-2 mm. Factors to consider in selecting the length L include but are not limited to: the frequency of operation, the thickness T of the heterostructure 36, the width W of the heterostructure. In general, a trade-off may be made between the length, thickness and width of the heterostructure so provide a large enough magnetic volume of heterostructure material and low enough power consumption (<2 Watts) for magnetic damping compensation sufficient to support proper operation.

On top of the heterostructure 36 and the electric insulator 34 are current injection pads 38, 40. Portions of ground plane 41 have been removed around the pads 38,40 to expose portions of electric insulator 34 which provide a nonconductive (or insulator) region 39b which separate pads 37, 38 from ground plane 41. Conductive signal paths 39a coupled to pads 38, 40 are disposed over heterostructure 36.

A static magnetic field (or bias field) $B_0$ is shown at an angle α relative an axis of heterostructure 36. In the example embodiment of FIG. 3A, a is selected to be approximately 45° to an axis 43 parallel to the long axis of the heterostructure 36.

External field $B_0$ may be applied in-plane at an angle α of approximately +/− ~45° relative to axis 43 but the angle may be optimized. When α is 0° (90°), the spin-photon coupling strength is maximized (minimized), while the magnetic damping tuning is minimized (maximized). The angle α may be optimized in order to simultaneously achieve sufficient spin-photon coupling and magnetic damping tuning.

In an embodiment, a first conductive pad 38 is disposed on a surface of the first end of the heterostructure 36 and a second conductor pad 40 is disposed on a surface of the opposite end of the heterostructure 36. As can be seen in FIG. 3B, conductive pad 40 is separated from (and insulated from) substrate 30 and cavity 32 by electric insulator 34. A segment of the cavity 32 formed in cavity layer 32 is left between the substrate 30 and the conductor pad 40. Due to the insulation, the current at that segment of the cavity 32 will not be disrupted by the current passing through the conductive pad 40.

As will be described in further detail below, in embodiments, the heterostructure 36 comprises one or more spin current source layers and one or more magnetic material layers. An electrical current passed is between first and second conductive pads 38, 40, through the spin current source. The spin current source simultaneously causes an oscillation in each of a plurality of magnetic domains of the magnetic material, wherein the oscillations have substantially the same phase. The oscillations in each magnetic domain may be phase-locked via spin-photon coupling to the cavity 32. In response to adjusting an electric current applied to the heterostructure 36, at least one of a dissipation rate and a coupling characteristic between the heterostructure 36 and the cavity 32 will be affected.

The heterostructure 36 spans a length L. In some embodiments, the width of the cavity 32 may be wider than the width of heterostructure 36.

Figure 3C:
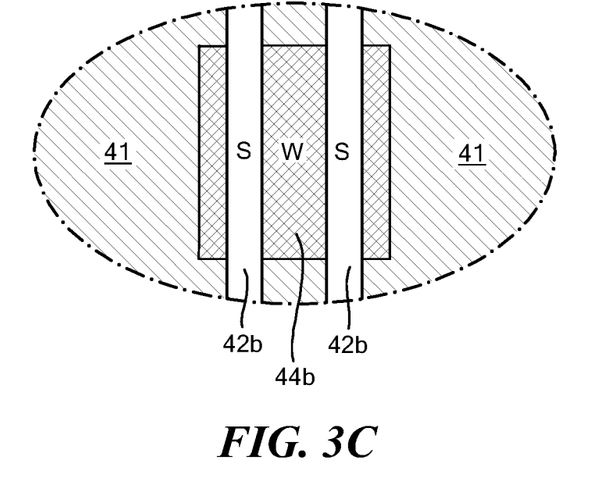
FIG. 3C is an enlarged view of a co-planar waveguide portion of the STO quarter-wave resonator device of FIG. 3A.
Figure 3D:
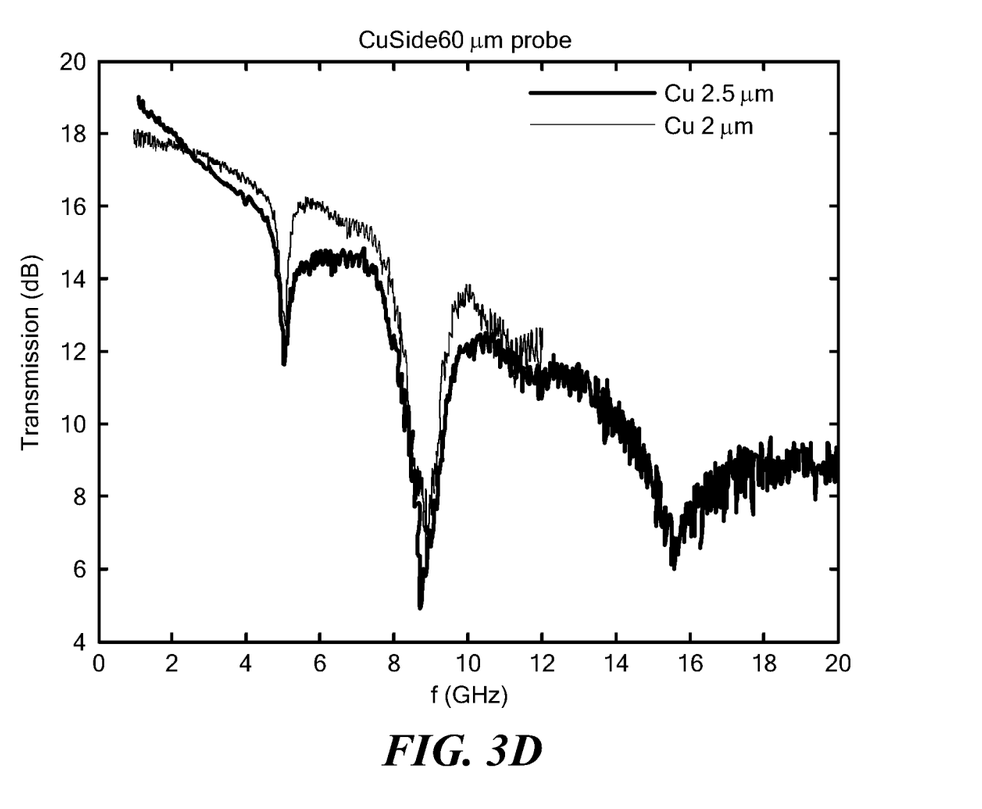
FIG. 3D is a plot of transmission vs. frequency for two different thicknesses of device copper.

Referring briefly to FIG. 3C, an enlarged portion of FIG. 3A illustrates a co-planar waveguide structure comprising center conductor 44b having a width W and spacing 42b having a width S. Thus, side edges of center conductor 44b are spaced from ground plane 41 by a distance S. In embodiments, the width W of center conductor 44b may be 60 μm and the spacing S may be 24 μm. In embodiments, the width W of center conductor 44b may be 40 μm and the spacing S may be 16 μm.

In embodiments, the substrate layer 30 (layer 0) may be provided from a material having a low loss and high electrical insulating characteristic such as Sapphire or any other material having loss and insulating characteristics which are the same as or similar to Sapphire. In embodiments, the resonant cavity 32 (layer 1) may be provided as or comprise a material having a high electrical conductivity characteristic such as copper (Cu) having a thickness in the range of about 1 μm to about 3 μm. Of course, other materials having an electrical conductivity characteristics which are the same as or similar to copper may be used. Any material having a conductivity high enough to achieve high Q-factor may be used. In embodiments, insulating layer 34 (layer 2) may be provided from silicon dioxide ($SiO_2$) having a thickness in the range of 100 nm-10 um to electrically isolate cavity 32 (layer 1) from the heterostructure layer 36 (layer 3) and conductive signal path 39a. Other materials having an electrical insulating characteristic which is the same as or similar $SiO_2$ may also be used. Current injection pads may be provided from an electrical conductor such as copper (Cu) having a thickness of about 300 nm. Other materials having electrical and mechanical characteristics which are the same as or similar to copper (Cu) may be used.

The details of heterostructure layer 36 will be described below in conjunction with FIGS. 5A, 5B.

Figure 4:
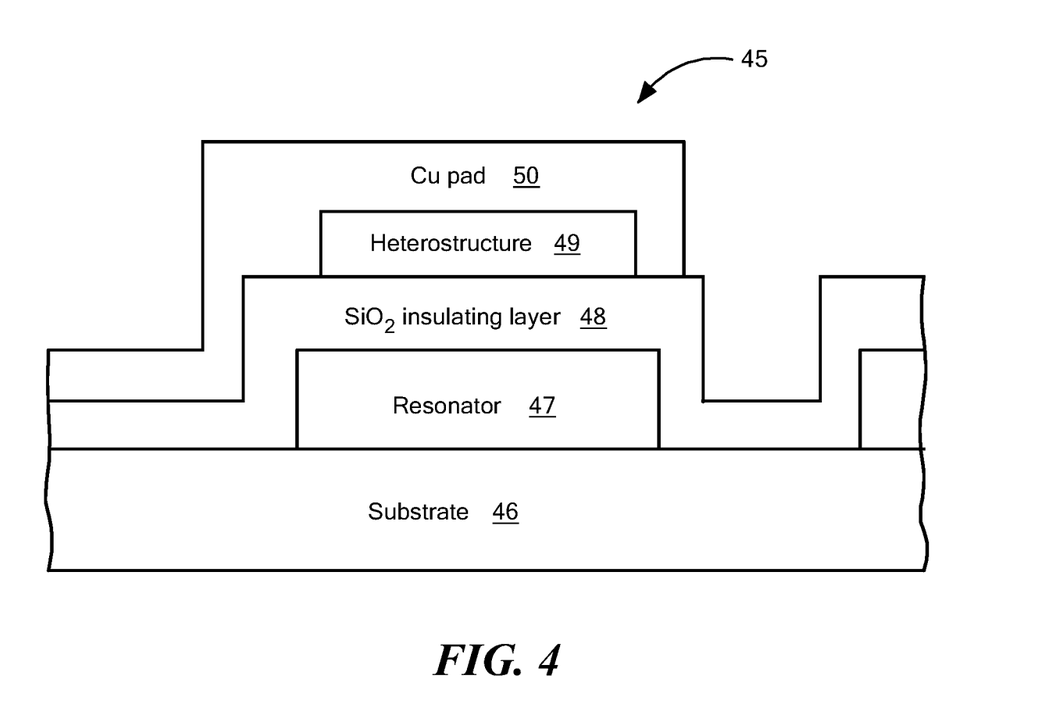
FIG. 4 is a cross-sectional view of an oscillator device in accordance with an embodiment disclosed herein.

Referring now to FIG. 4, an embodiment a portion of an oscillator device 45 which may be the same as or similar to oscillator 29, includes substrate 46, upon which an electric conductor cavity 47 is formed. As noted above the substrate (e.g. substrate 46) may be made of an electrically insulating substrate, such as sapphire. The substrate 46 may be selected to have certain physical characteristics, such as thickness of about 430 μm, that will reduce (and ideally minimize) electrical losses during operation of the device. In embodiments, cavity 47 may be formed from an electrically conductive material. In embodiments, the electrically conductive material, may be provided as copper, silver, or gold having a thickness illustratively in the range of between about 400 nm and about 10 μm.

An insulating layer 48 is disposed over portions of substrate 46 and electric conductor cavity 47. A heterostructure 49 is disposed over at least portions of electric conductor cavity 47 with portions of insulating layer 48 disposed between electric conductor cavity 47 and heterostructure 49. An electrically conducting pad 50 is disposed over at least portions of heterostructure 49 and over insulating layer 48. In embodiments, electrically conducting pad 50 may have a thickness of at least 50 nm and made be made from copper, or silver, or gold.

The electric insulator 48 is disposed on a surface of the substrate 46 and the electric conductor cavity 47. The electric insulator 48 is disposed on a surface of electric conductor cavity 47 in order to insulate electric conductor cavity 47 from the heterostructure 49 and the electrically conducting pad 50. In embodiments, for operation in the range of about 5 GHz, insulating layer 48 may have a thickness in the range of about 10 nm to about 10 μm, and may be made of silicon dioxide, or silicon nitride, or aluminum oxide, or magnesium oxide, or another suitable insulator.

Figure 5A:
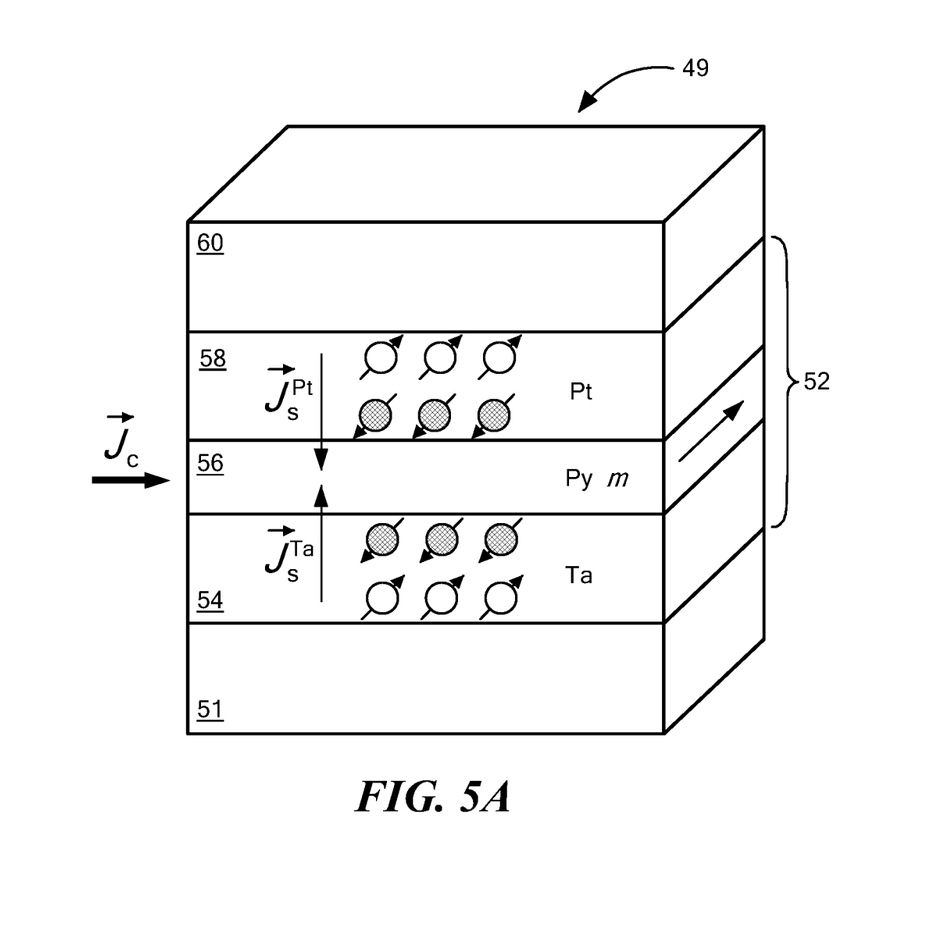
FIGS. 5A and 5B are a side-view of the cross section of the heterostructure in accordance with an embodiment disclosed herein.

Referring now to FIG. 5A an example heterostructure 49 comprising layers of a first spin current source layer 54 and a second spin current source layer 58, between which resides a magnetic material layer 56. To achieve large enough coupling strength g between magnetic materials and the resonator photon mode using a low enough RF field per unit of inductor current $b_{rf}$, heterostructure 49 may require a lot of magnetic material. The coupling strength g should in general be larger than or comparable to the magnon dissipation rate $K_m$ and the resonator photon dissipation rate $K_r$, which would generally require $g/2\pi > 200$ MHz. $b_{rf}$ should in general be smaller than 0.1 Tesla/Ampere for a cavity width in a few micrometers scale. However, for the spin current injection to be efficient, that magnetic material layers need to be thin. Moreover, performance is improved if the magnetic material has high saturation magnetization $4\pi M_s > 0.9$ T, low Gilbert damping coefficient $\alpha < 0.02$, and partial perpendicular magnetic anisotropy (PMA). Following, multiple layers of magnetic material may be used in order for the spin current injection to be efficient.

In an embodiment, layers 52 of the heterostructure 49 may be repeated one or more times as desired to form various sub-layers. Thus, in some embodiments, heterostructure 49 comprises a first stack of sub-layers 51 and a second stack of sub-layers 60, wherein each is comprised of the layers 52. In FIG. 5A, the first stack of sub-layers 51 is positioned below the layers 52, while second stack of sub-layers 60 is positioned on top of the layers 52. Each layer in such a stack of sub-layers may be thin, at most 20 nm in thickness and in some embodiments below 10 nm.

The thickness of the magnetic material layer 56 may be selected to achieve efficient spin torque and at the same time achieve a high coupling strength. The thickness of each spin current source layer 54, 58 may be chosen to be comparable to their spin diffusion lengths for blocking spin flows in the unwanted direction and maximizing the SHE. A length of portion L, as depicted in FIG. 3A, of the heterostructure and the number of repetitions of the heterostructure may be selected to provide an amount of magnetic material which provides a desired level of total number of magnetic spins.

In one embodiment, the first spin current source layer 54 comprises 5 nm tantalum (Ta) and the second spin current source layer 58 comprises 5 nm platinum (Pt). Ta and Pt are both spin-current sources, but they have opposite spin-Hall angles so that the spins injected into the Py are of the same sign. Magnetic material layer 56 is made of 10 nm magnetic permalloy (Py). Py does not have partial PMA.

In one embodiment, spin current source layer 54 comprises 5 nm Ta and second spin current source layer 58 comprises 7 nm Pt. Magnetic material layer 56 comprises several magnetic layers of 0.6 nm cobalt (Co) and 0.6 nm nickel (Ni). The combination of cobalt and nickel is magnetic and has partial PMA. The number of magnetic layers may be varied in different embodiments.

In one embodiment, spin current source layer 54 comprises 6 nm Ta and layer 58 comprises 1.2 nm magnesium oxide (MgO). Magnetic material layer 56 comprises 1.5 nm cobalt-iron-boron (CoFeB). The thin magnetic CoFeB between the Ta and MgO layers may have partial PMA. Notably, the MgO is not a spin-current source, but helps to achieve the partial PMA.

It is appreciated that other embodiments of the concepts, techniques, and structures describe herein may be recognized by a person having ordinary skill in the art. Such other embodiments may use different materials, or different dimensions, but may operate in a similar or identical way.

Figure 5B:
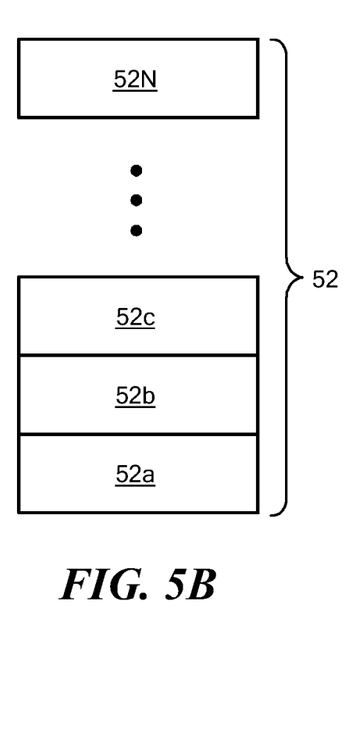

In general, as illustrated in FIG. 5B, heterostructure 49 may comprise N layers 52a-52N. Thus, spin current source/magnetic material may be stacked vertically. In preferred embodiments each layer is thin (e.g. less than or equal to about 20 nm).

In embodiments, the stacking may be repeated n times. The specific thicknesses (in nm below) and the repetition number n may be determined to suit the need of the particular application. A variety of different structures may be used with several example structures described below:

Structure 1: [Ta 5/Py 10/Pt 5]$_n$. Ta and Pt are both spin current sources, but they have opposite spin-Hall angles so that the spins injected into Py (magnetic material) by them are of the same sign. Py does not have partial PMA.

Structure 2: [Pt 7/[Co 0.6/Ni 0.6]$_x$/Ta 5]$_n$. The [Co 0.6/Ni 0.6]$_y$ is magnetic material which can have partial PMA. The number x is the repetition number to be optimized in order to simultaneously achieve sufficient magnetic volume, efficient SHE for magnetic damping tuning, and suitable PMA for reducing the threshold current for damping compensation.

Structure 3: [Ta 6/CoFeB 1.5/MgO 1.2]$_n$. The thin magnetic CoFeB in between Ta and MgO can have partial PMA. MgO is not spin current source but helps partial PMA.

Figure 6A:
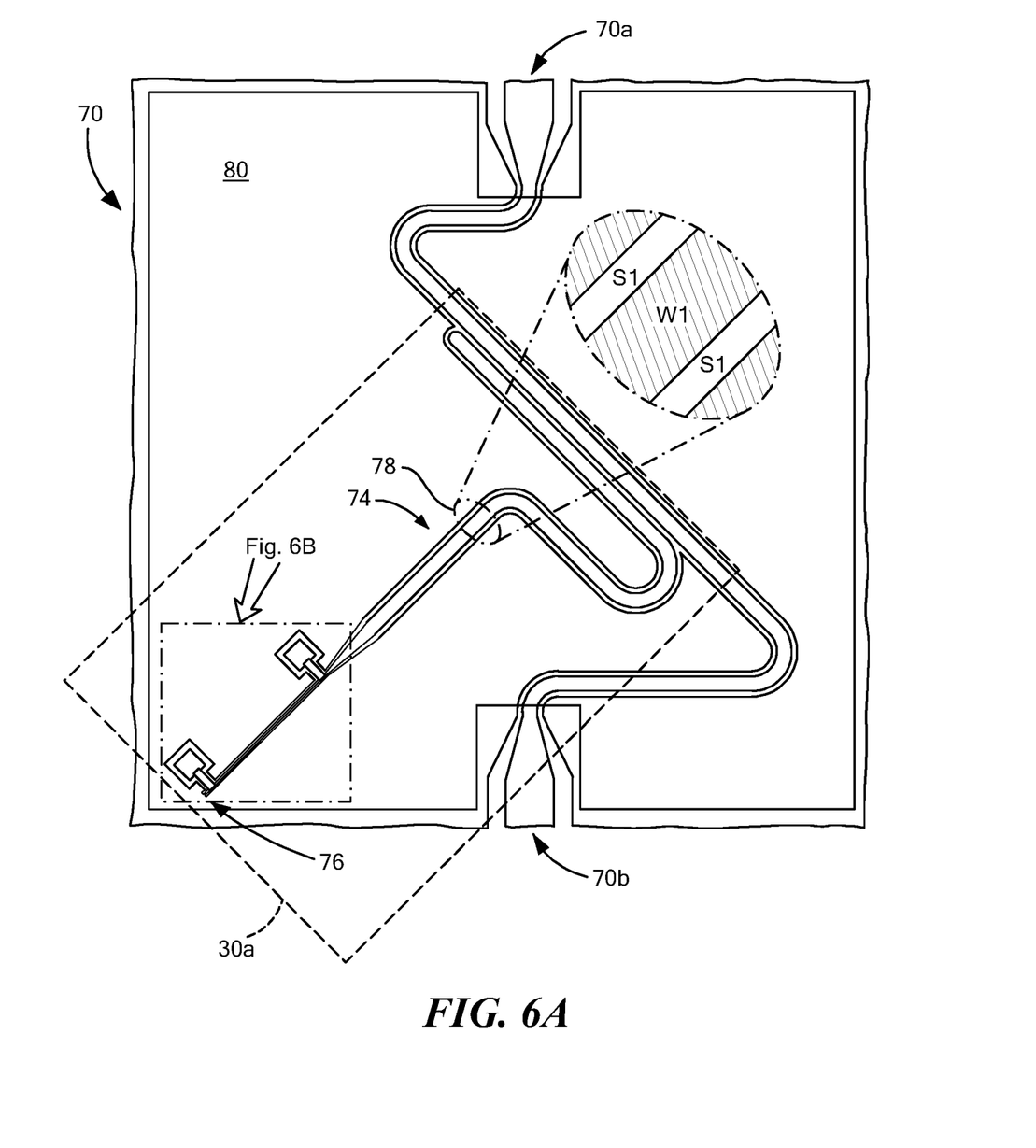
FIG. 6A is an alternate embodiment of an STO having varying widths of a resonator transmission line.
Figure 6B:
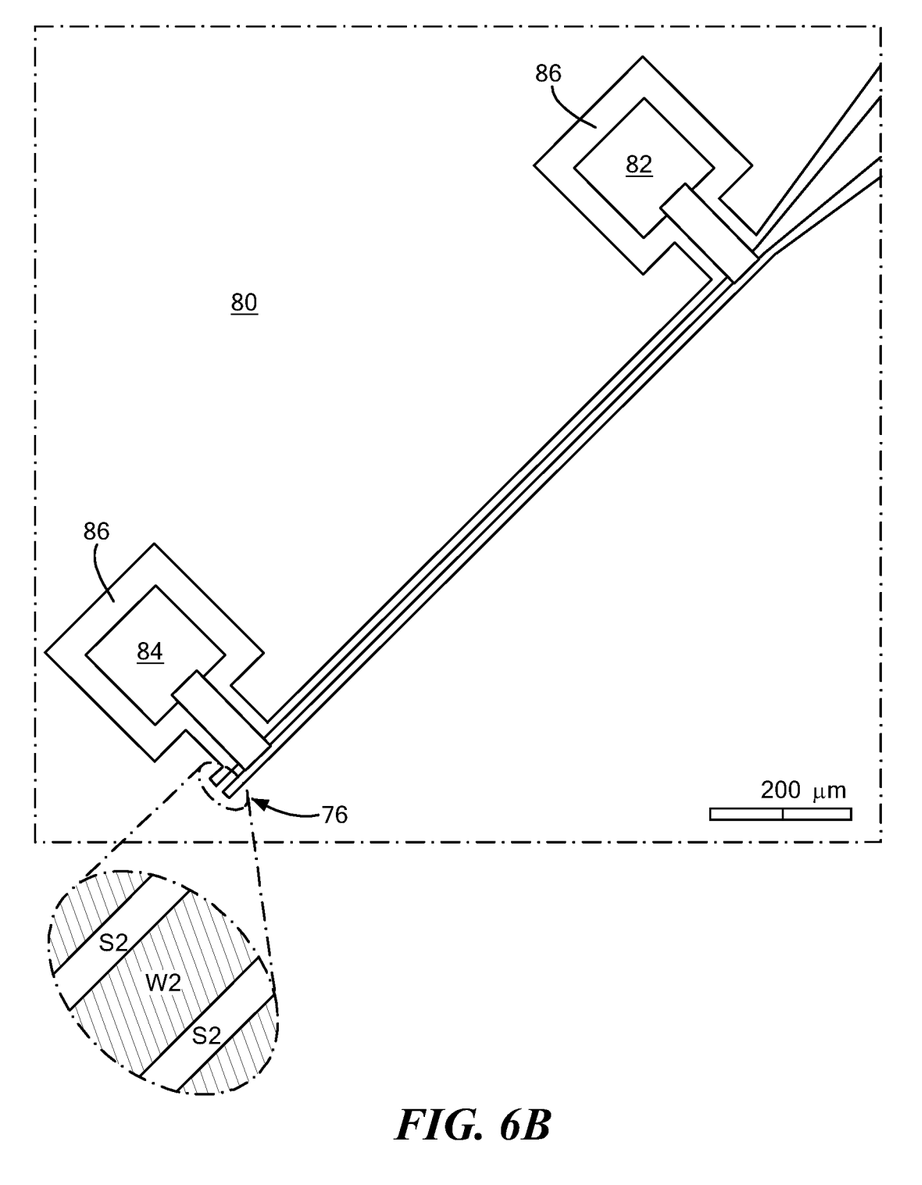
FIG. 6B is an enlarged view of a portion of the STO of FIG. 6A.

Referring now to FIGS. 6A and 6B, in which like elements are provided having like reference designations, an oscillator embodiment 70 having ports 70a, 70b, comprises a quarter-wave resonator 30a implemented with a coplanar waveguide transmission line 74 having a first end 76 shorted to ground plane 80 (ground plane 80 may be the same as or similar to the ground plane 41 as described above in conjunction with FIG. 3A) and a second end open, and coupled to an external coplanar waveguide with ports 70a and 70b.

In this example embodiment, the dimensions of resonator changes between the first end 76 (proximate pad 84) and the second end proximate pad 82, including nonconductive region 86. In embodiments, the resonator is narrower at the part where layer 3 is deposited. This approach may enhance spin-photon coupling. For example, the width W2 of the resonator may change to 15 μm in the embodiment of FIG. 6A as compared to a width W1 of 90 μm in the embodiment of FIG. 6A.

Various combinations of widths and spacings in first end 76 may be used. For example, for operation at a frequency of about ~5GHz and region 78 having W1=90 μm, S1=36 μm, various combinations of widths W2 and spacings S2 may be used in first end 76 as shown in Table 1 below.

TABLE 1

| W2 | S2 |
|---|---|
| 20 μm | 14 μm |
| 20 μm | 12 μm |

TABLE 1-continued

| W2 | S2 |
|---|---|
| 20 μm | 10 μm |
| 15 μm | 12 μm |
| 15 μm | 10 μm |
| 12 μm | 10 μm |
| 12 μm | 8 μm |
| 9 μm | 10 μm |
| 9 μm | 8 μm |

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

For example, it is recognized that a variety of different material structures of layer 3 (spin current source+magnetic material) are possible and the particular material structure to use will depend upon a variety of factors including, but not limited to frequency of operation, physical space, material deposition methods, charge-to-spin conversion efficiency in the spin current sources, saturation magnetization, magnetic anisotropies, and damping of the magnetic materials.

In general the inventors have recognized that lots of magnetic material is needed as the inventors have also recognized that to have $N_s$ increase $b_{rf,c}$ should decrease but the material needs to be thin for the spin current injection to be efficient. Moreover, the inventors have recognized that it is better if the magnetic material has high saturation magnetization $M_s$, low damping, and partial perpendicular magnetic anisotropy (PMA).

To achieve this goal, as described herein one solution is to stack spin current source/magnetic material vertically. In preferred embodiments each layer is thin (e.g. less than or equal to about 20 nm).

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What may be claimed includes:

1. An oscillator comprising:
   a cavity, the cavity comprising an electrical conductor;
   an electrical insulator disposed on a surface of the cavity; and
   a heterostructure disposed on a surface of the electrical insulator and having a first end and a second end, the heterostructure comprising one or more spin current source layers and one or more magnetic material layers;
   wherein in response to an electrical current passed through the spin current source, an oscillation occurs in a plurality of magnetic domains of the magnetic material, wherein the oscillations have substantially the same phase.

2. The oscillator of claim 1, wherein the heterostructure comprises multiple repetitions of the one or more spin current source layers and the one or more magnetic material layers.

3. The oscillator of claim 2, wherein a length of the heterostructure and the number of repetitions of the heterostructure are selected to provide an amount of magnetic material which provides a desired total number of spins.

4. The oscillator of claim 1, wherein each layer in the heterostructure is less than about 20 nm in thickness.

5. The oscillator of claim 1, wherein the oscillator further comprises a first electrically conducting pad disposed on a surface of the first end of the heterostructure and a second electrically conducting pad disposed on a surface of the second end of the heterostructure.

6. The oscillator of claim 5, wherein the first electrically conducting pad and the second electrically conducting pad comprises an electrical conductor having a thickness of at least 50 nm, wherein the first electrically conducting pad and the second electrically conducting pad comprises copper, silver, or gold.

7. The oscillator of claim 1, wherein in response to adjusting an electrical current applied to the heterostructure at least one of a dissipation rate and a coupling characteristic between the heterostructure and the cavity is adjusted.

8. The oscillator of claim 1, wherein the cavity is disposed on a surface of a substrate; wherein the substrate comprises an electrical insulator.

9. The oscillator of claim 1, wherein the oscillations in each magnetic domain are phase-locked via spin-photon coupling to the cavity.

10. The oscillator of claim 1, wherein the cavity has a thickness between 400 nm and 10 μm, wherein the electric insulator has a thickness between 10 nm and 10 μm.

11. The oscillator of claim 1, wherein the cavity comprises copper, silver, or gold; wherein the electric insulator comprises silicon dioxide, or silicon nitride, or aluminum oxide, or magnesium oxide.

12. An oscillator comprising:
    a substrate;
    a cavity disposed on a surface of the substrate, the cavity comprising an electrical conductor;
    an electrical insulator disposed on a surface of the cavity;
    a heterostructure disposed on a surface of the electric insulator and having a first end and a second end, the heterostructure comprising one or more spin current source layers and one or more magnetic material layers; and
    a first electrically conducting pad disposed on a surface of the first end of the heterostructure and a second electrically conducting pad disposed on a surface of the second end of the heterostructure;
    wherein an electrical current passed from the first pad to the second pad through the spin current source simultaneously causes an oscillation in each of a plurality of magnetic domains of the magnetic material, wherein the oscillations have substantially the same phase.

13. The oscillator of claim 12, wherein the oscillations in each magnetic domain are phase-locked via spin-photon coupling to the cavity.

14. The oscillator of claim 12, wherein the cavity has a thickness between 400 nm and 10 μm; wherein the electric insulator has a thickness between 10 nm and 10 μm; and wherein the first electrically conducting pad and the second electrically conducting pad comprises an electrical conductor having a thickness of at least 50 nm.

15. The oscillator of claim 12, wherein the cavity comprises copper, silver, or gold; wherein the electric insulator comprises silicon dioxide, or silicon nitride, or aluminum oxide, or magnesium oxide, and wherein the first electrically conducting pad and the second electrically conducting pad comprises copper, silver, or gold.

16. The oscillator of claim 12, wherein the heterostructure comprises multiple repetitions of the one or more spin current source layers and the one or more magnetic material layers.

17. The oscillator of claim 16, wherein each layer in the heterostructure is less than about 20 nm in thickness.

18. A microwave photon-magnon hybrid system comprising:
    a device comprising at least one Spin Hall Effect (SHE) layer and at least one magnetic material layer, wherein in response to a charge current flowing through the SHE layer non-equilibrium spins are injected into the at least one magnetic material layer to change a magnon dissipation rate; and
    a microwave resonator inductively coupled to the device with magnons, wherein the dissipation rates and the coupling cooperativity can be adjusted via the application of an electrical current applied to the SHE layer.

* * * * *